United States Patent [19]

Lunski et al.

[11] Patent Number: 5,575,857
[45] Date of Patent: Nov. 19, 1996

[54] AQUEOUS ALKALINE METAL DESCALING CONCENTRATE AND METHOD OF USE

[75] Inventors: Michael S. Lunski, Hightstown; Richard A. Reynolds, Plainsboro, both of N.J.

[73] Assignee: Church & Dwight Co., Inc., Princeton, N.J.

[21] Appl. No.: 502,641

[22] Filed: Jul. 14, 1995

[51] Int. Cl.$^6$ .............. C02F 5/08; C02F 5/10; C23F 4/04

[52] U.S. Cl. .............. 134/2; 134/3; 134/40; 252/174.14; 252/180; 252/175; 510/175; 510/176; 510/362; 510/435; 510/509

[58] Field of Search .............. 252/175, 180, 252/80, 82, 174.14, 86; 134/3, 40, 2; 210/696

[56] References Cited

U.S. PATENT DOCUMENTS

| | | | |
|---|---|---|---|
| 103,662 | 5/1870 | Rogers | 252/86 |
| 149,097 | 3/1874 | Burgess | 252/86 |
| 868,159 | 10/1907 | Williams, Jr. | 252/80 |
| 3,053,897 | 9/1962 | Clark et al. | 564/506 |
| 3,360,399 | 12/1967 | Knox et al. | 252/80 |
| 3,447,963 | 6/1969 | Callahan | 252/80 |
| 3,684,720 | 8/1972 | Richardson | 252/86 |
| 3,808,143 | 4/1974 | Gardner | 252/82 |
| 4,155,857 | 5/1979 | Jones | 252/8.55 |
| 5,234,506 | 8/1993 | Winston et al. | 134/40 |
| 5,264,046 | 11/1993 | Winston et al. | 134/42 |
| 5,322,635 | 6/1994 | Hieatt et al. | 252/82 |
| 5,393,448 | 2/1995 | Winston et al. | 252/109 |
| 5,431,847 | 7/1995 | Winston et al. | 252/174.24 |
| 5,464,553 | 11/1995 | Winston et al. | 252/108 |

*Primary Examiner*—Prince Willis, Jr.
*Assistant Examiner*—Alan D. Diamond
*Attorney, Agent, or Firm*—Irving M. Fishman

[57] ABSTRACT

The scale formed by use of alkaline salt-based cleaners and which comprises one or more alkaline salts and organic scale is removed by applying an aqueous solution comprising alkali metal carbonate salts and optionally, a hydrotrope to remove the organic scale. A mixture of potassium and sodium carbonate salts has been found to effect better descaling than use of either of the salts alone.

11 Claims, No Drawings

AQUEOUS ALKALINE METAL DESCALING CONCENTRATE AND METHOD OF USE

FIELD OF THE INVENTION

This invention relates to the removal of scale from surfaces. In particular, the invention relates to a novel descaling composition for removing scale deposited from alkaline salt-based cleaners and which forms on industrial cleaning equipment and the like.

BACKGROUND OF THE INVENTION

Aqueous cleaning compositions containing alkaline salts, surfactants and other adjuvants have been recently developed to clean a wide variety of surfaces. These aqueous salt cleaners are particularly advantageous since the cleaners are effective and safe to use, handle and dispose of and, accordingly, can replace the more harmful, environmentally unsafe highly basic or organic-based solvents and cleaners previously utilized. Among the particularly useful aqueous cleaners are those developed by the present assignee and which are based on alkali metal carbonates and/or bicarbonates. Separate cleaners have been developed such as for cleaning metal surfaces and, uniquely for cleaning flux residues from electronic circuit assemblies. The aqueous alkaline salt-based cleaners used for the latter purpose are marketed under the tradename ARMAKLEEN®. These cleaners are finding increasing acceptance as a replacement for the halogenated hydrocarbon and other volatile organic solvents previously used to remove flux residues, in particular, rosin flux residues. The cleanliness of electronic circuit assemblies, such as printed circuit boards or printed wiring boards, is generally regarded as being critical to their functional reliability. Ionic and nonionic contamination on circuit assemblies is believed to contribute to premature failures of the circuit assemblies by allowing short circuits to develop.

In the manufacture of electronic circuit assemblies, ionic and nonionic contamination can accumulate after one or more steps of the process. Circuit assembly materials are plated, etched, handled by operators in assembly, coated with corrosive or potentially corrosive fluxes and finally soldered.

In the fabrication of electronic circuit assemblies, soldering fluxes are first applied to the substrate board material to ensure firm, uniform bonding of the solder. These soldering fluxes fall into three broad categories: rosin fluxes, water soluble fluxes and no-clean. The rosin fluxes, which are generally only moderately corrosive and have a much longer history of use, are still widely used throughout the electronics industry. The water soluble fluxes, which are a more recent development, are being used increasingly in consumer products applications. These water soluble fluxes are very corrosive. The no-clean fluxes are a very recent development and apparently do not require removal from the circuit assemblies. Unfortunately, residues of any flux are believed to cause circuit failure if residual traces of the material are not carefully removed following soldering and, thus, remain on an electronic circuit assembly.

The water soluble flux residues have been removed with water or warm detergent solutions. Recently, the present assignee has developed an aqueous alkaline salt solution for effective removal of water soluble flux residues and which not only removes the flux residues but also has been found to remove the "white residues" which have been problematic when using water soluble fluxes. The useful cleaner for removing water soluble flux residues is described in U.S. patent application Ser. No. 08/391,015, filed, Feb. 21, 1995.

The removal of rosin flux residues from circuit assemblies, however, has been much more difficult and has traditionally been carried out with the use of chlorinated hydrocarbon solvents, mixtures of such solvents or other volatile organic solvent materials. The use of such solvents is very disadvantageous in view of the toxicity and environmental problems inherent in such materials and, accordingly, the use of such solvents has been subjected to close scrutiny by various government agencies.

To replace these solvent materials for use in cleaning rosin flux residues from circuit assemblies, the present assignee has as above said developed the ARMAKLEEN® cleaner which is an aqueous-based cleaner comprising alkali metal salts such as alkali metal carbonate and/or alkali metal bicarbonate salts, alkali metal silicates for use as a corrosion inhibitor as well as organic adjuvants such as surfactants to improve the efficacy of cleaning, anionic polymers to stabilize the silicate in solution as well as hydrotropes to maintain the surfactants in aqueous solution. This aqueous-based rosin flux remover is the subject of several U.S. patents including U.S. Pat. No. 5,234,506 which is herein incorporated by reference. These aqueous-based cleaners have been found to be very effective for removing the rosin flux residues and are substantially safer to use than the previous organic solvent-based cleaners. Unfortunately, during use, as the aqueous phase of the cleaner evaporates, there has been left behind on equipment surfaces a solids residue in the form of scale. This scale can plug drains and plague the operation of continuous cleaning equipment including conveyor belts, spray nozzles and the like, thus, not only causing a problem of aesthetics, but also reducing the efficiency of the cleaning process. The scale which remains is primarily that of carbonate, silicate and mixed salts as well as organic residues including that of the surfactants and possibly carboxylated polymer materials which are believed to render the scale intractable.

While the descaling composition of the present invention is applicable for the removal of any scale formed from inorganic salt-based aqueous cleaners, the descaler of the present invention is particularly useful in removing the scale which is formed upon use of the alkaline salt flux removing cleaners which include alkaline salts, surfactants, alkali metal silicate corrosion inhibitors and which have been found to leave a water insoluble scale upon evaporation of the aqueous phase. The unsightly scale causes maintenance along with operational problems during the cleaning process. Although the scale can be removed by use of concentrated acids or alkali materials such as sulfuric or phosphoric acid or sodium or potassium hydroxide, the use of these materials jeopardizes the health and safety of the workers and, thus, are disadvantageous. Additionally, these strong acids and bases are corrosive to the cleaning apparatus.

It would be useful to remove the scale which is produced upon the use of alkaline salt-based cleaners without using the highly corrosive concentrated acid or basic scale removers which have been previously used.

Accordingly, it is the primary objective of the present invention to provide a novel descaling formulation which will remove scale formed from inorganic salt-based cleaners.

Another object of the present invention is to provide a novel descaling composition which is at least as effective as strong acid and basic descaling compositions and which is substantially more safe to use and less toxic to the environment.

Still another object of the invention is to provide an improved method of removing from cleaning equipment water insoluble scale formed from inorganic salt-based cleaners.

These and other objects which are achieved according to the present invention can be readily discerned from the following description of the invention.

SUMMARY OF THE INVENTION

The present invention comprises a novel descaling composition comprising one or more alkali metal carbonate salts and, optionally, a hydrotrope. The descaling composition is used in aqueous solution to remove scale from contaminated surfaces. The descaler of the present invention is particularly effective to remove water insoluble scale formed from inorganic salts such as alkali metal carbonates, bicarbonates and silicates and organic residues such as formed by surfactants and the like.

The descaling composition of the present invention is preferably formulated as an aqueous concentrate containing the one or more alkali metal carbonates, hydrotrope and water. Upon use, the concentrate is further diluted with water and applied onto the scale deposits which are subsequently loosened and removed from the surface on which the scale has formed. The descaler concentrate and the diluted concentrate for use is buffered so as to have a pH of about 10–12.5.

DETAILED DESCRIPTION OF THE INVENTION

The descaling composition of the present invention comprises one or more alkaline salts in the form of one or more alkali metal carbonates. Most suitable are the carbonate salts of potassium and sodium. Most preferably, the descaling composition of the present invention comprises a mixture of alkali metal carbonate salts, in particular, mixtures of potassium and sodium carbonates. The carbonate salts which can be used include potassium carbonate, potassium carbonate dihydrate, potassium carbonate trihydrate, sodium carbonate, sodium carbonate decahydrate, sodium heptahydrate and sodium carbonate monohydrate. Mixtures of potassium carbonate and sodium carbonate monohydrate have been found particularly effective.

The descaling composition of this invention also preferably includes at least one hydrotrope. The hydrotropes added to the descaling composition are believed to solubilize in the aqueous phase the organic scale which is adhered to the contaminated surface. This organic scale typically will comprise that of any surfactants, defoaming agents and residues of carboxylated polymers which are themselves used as descaling agents in metal cleaners or if alkali metal silicates are present in cleaning solutions, to maintain the alkali metal silicates in solution at relatively low pHs below 11.5.

The hydrotropes useful in this invention include the sodium, potassium, ammonium and alkanol ammonium salts of xylene, toluene, ethylbenzoate, isopropylbenzene, naphthalene, alkyl naphthalene sulfonates, phosphate esters of alkoxylated alkyl phenols, phosphate esters of alkoxylated alcohols and sodium, potassium and ammonium salts of the alkyl sarcosinates. A particularly preferred hydrotrope is one that does not foam. Among the most useful of such hydrotropes are those which comprise the alkali metal salts of intermediate chain length linear monocarboxylic fatty acids, i.e., $C_7$–$C_{13}$. Particularly preferred are the alkali metal octanoates and nonanoates.

The descaling composition of the present invention is preferably formulated as an aqueous concentrate and is utilized to remove scale by diluting the aqueous concentrate with additional water. The diluted descaling composition concentrate is then applied at elevated temperatures by various means to those surfaces which contain water insoluble scale deposits. The descaling composition formulated as an aqueous concentrate will comprise from about 45 to 80 wt. % water, preferably, deionized, 10 to 40 wt. % of one or more alkali metal carbonates and 0 to 15 wt. % of the hydrotrope. It is preferable that the total salt content, that being the total amount of alkali metal carbonates present in the concentrate not be greater than 50% of the water content in the concentrate so as to insure that the components do not salt out of the aqueous solution. More preferably, the descaling composition in concentrate form will contain 45–80% water, 0–35 wt. % potassium carbonate, 0–35 wt. % sodium carbonate, and 5–15 wt. % hydrotrope where again, the total carbonate concentration will comprise 10–40 wt. % and wherein the salt content is no greater than 50 wt. % of the total water in the concentrate. It is most preferred to utilize a combination of the potassium and sodium carbonates.

The descaling composition of this invention can include other adjuvants if desired. Thus, small amounts of a defoaming agent as exemplified by alkoxylated fatty alcohols (nonionic surfactants) can be included. With respect to the concentrate, the defoaming agent can be added in amounts of 0–5 wt. % but, most likely, if included, should be added in amounts of less than 1 wt. %. The descaling composition can contain additional alkaline salts such as alkali metal bicarbonates. With respect to the concentrate, 0–10 wt. % alkali metal bicarbonates can be added. However, it is important that if bicarbonates are added that the pH of the concentrate still remain above 10.0, preferably, above 10.5.

Although not preferred, it is also optional to add sodium or potassium hydroxide to the descaling composition. Again, with respect to the concentrate, amounts of sodium or potassium hydroxide included in the composition will range from about 0–10 wt. %. However, for safety reasons, it is desirable to keep the pH of the concentrate and the use solution below 12.5. Other adjuvants such as surfactants, whether anionic, cationic or nonionic, can be added to increase the efficacy of removing the scale. It is preferred, however, to limit the amount of organic materials included in the descaling composition for several reasons, one being that it is desirable to reduce the BOD and COD of any waste water stream and secondly, the organic materials especially at the elevated temperatures may simply add to the scaling problem. Accordingly, the amounts of such organic adjuvants should be limited.

While the descaling composition is preferably formulated in aqueous concentrate form and then further diluted, it is possible to formulate the descaling composition in other forms known in the art and which can then be mixed with water for use.

In use, the descaling composition in the form of an aqueous concentrate will be used generally in concentrations of 10–40 wt. %. The preferred dilution of the concentrate will vary depending upon how the aqueous solution of the descaling composition is applied to the contaminated surface. The descaling composition in aqueous solution can be applied to remove the scale from contaminated surfaces by immersion, spray, brush or any other type of agitation. If immersion is used to apply the descaling composition, such as by filling a tank which has contaminated interior surfaces, the descaling composition as a concentrate will preferably comprise 20–40 wt. % of the aqueous use solution. If applied by spray nozzles, the concentration of the descaling composition as concentrate will preferably range from about 10 to 25 wt. %. Generally, the aqueous solution containing the descaling composition of the present invention is heated to temperatures of about 100°–160° F., preferably from about 125°–150° F. The surfaces should preferably be rinsed with clean water subsequent to the removal of scale.

If added to water in a form other than an aqueous concentrate, the concentration of the active ingredients of the descaling composition in aqueous solution should be the same as the concentration of the active ingredients when used as a diluted aqueous concentrate as described above. The active ingredients can be added to a separate supply of heated water and the active solution then applied by any of the application techniques described above. If, for example, a cleaning tank is to be cleaned, the tank can be filled with water, the temperature of the water raised to the working temperature and the actives then added to the water bath at the appropriate concentration.

As previously stated, the descaling composition of the present invention is preferably used to remove inorganic salt scale such as carbonates, bicarbonates and silicates which has been formed by the evaporation of an aqueous phase from an inorganic salt cleaning composition. Cleaning compositions also can include organic materials such as surfactants and carboxylated stabilizers or complexing agents which may also be deposited as a water insoluble scale especially if elevated temperatures are utilized during the cleaning process. The descaling composition of the present invention is particularly useful for removing the scale which is formed upon using an alkaline salt cleaner capable of removing flux residues from circuit assemblies. In general, the cleaning process for removing flux residues is a continuous process. In such process, the circuit assemblies are deposited on a conveyor assembly which traverses one or more cleaning stations and one or more rinsing stations. Each cleaning and rinsing station is a tank or other similar receptacle wherein the conveyor assembly containing the assemblies is immersed and then withdrawn to drain excess solution from the assemblies. In either the cleaning bath or rinse bath, the cleaning solution or rinse water can be applied by spray nozzles within the respective wash or rinse tanks. Subsequent to final rinsing, the conveyor assembly is then withdrawn from the tank and the circuit assemblies removed from the conveyor system which is then recycled to carry more circuit assemblies through the cleaning process. During the cleaning and rinsing process, there is constant evaporation of the water and formation of scale on the inside of the wash and rinse tanks, on the spray or application nozzles which apply the cleaning solution, on the outside of the tanks due to any spillage or draining operation and over the conveyor assembly. The scale is unsightly and, can in fact, hinder the smooth operation of cleaning the flux residues from the circuit assemblies by plugging the spray nozzles and accumulating on bearing surfaces of the conveyor assembly and the like.

The descaling composition of the present invention when used in aqueous solution has been found to remove the alkaline salt and organic residue scale from the alkaline salt flux cleaners in a safe manner without corroding the equipment surfaces and without the harm to the operators.

Thus, any scale which is present on the inside of the equipment such as the inside of the wash or rinse tanks can be treated by draining the tanks of any excess washing or rinsing solution and then adding the descaling composition such as in an aqueous concentrate in water. Typically the aqueous concentrate of the descaling composition will comprise 20–40% in water. Higher concentrations of the composition for more aggressive descaling of higher volume scale can be used while lower concentrations may be used for less aggressive descaling of lower volumes of scale. The descaling solution should be heated to 125°–150° F. Scale that is present on the outside areas of equipment, loading stations, sides of the wash or rinse tanks, drain backs, conveyor belts, etc. can be removed by dipping a rag or cloth in descaling solution and wiping down the area to be descaled or spray nozzles may be used to apply the descaling composition to the effective areas. Other means to remove the scale can be by applying the descaling solution with a brush or other application device.

The examples presented below are for the purposes of illustrating the invention only and should not be construed to strictly limit the claimed invention solely to the embodiments disclosed therein.

EXAMPLE 1

The aqueous descaling solutions of the present invention were tested for efficacy and compared against various strong acid and base descaling solutions. Testing was achieved by placing scale covered coupons in the test solutions which were heated to 125°–130° F. for 30 to 45 min. The test coupons were prepared by allowing the aqueous phase of an inorganic salt-based saponifier composition to evaporate on glass slides. The percent residual scale removed was determined by weight difference before versus after treatment in the descaling solutions.

The results of testing and the exact nature of the descaling compositions which are designated are set forth in Tables 1 and 2, respectively.

TABLE 1

| Descaling solutions | % Residue removed |
| --- | --- |
| 5% NaOH | 99.96 |
| Descaling B | 99.89 |
| 20% potassium carbonate | 97.82 |
| Descaling C | 97.57 |
| 5% $H_3PO_4$ | 89.22 |
| phosphoric acid-based solution | 64.06 |
| Descaling A | 46.56 |

TABLE 2

| Descaling solutions | |
| --- | --- |
| Descaling A: | 10% sodium carbonate monohydrate |
| Descaling B: | Mixture of both A & C |
| Descaling C: | 10% potassium carbonate |

As can be seen, the carbonate-based solutions and, in particular, those carbonate-based solutions which contain higher levels of carbonate were just as effective as the sodium hydroxide solution and more effective for removing scale than the phosphoric acid solutions. It is interesting to note that descaling formulation B which comprised a mixture of both sodium carbonate monohydrate and potassium carbonate without hydrotrope was more effective than either the 20% potassium carbonate solution or the respective 10% potassium and sodium carbonate descaling solutions A and C.

EXAMPLE 2

The same procedure as Example 1 was followed to compare various aqueous descaling solutions containing variable amounts of the carbonate salts with and without the hydrotrope. The results of testing relative to the removal of the residue from the coupons and the nature of the descaling composition used in Example 2 are set forth in Tables 3 and 4, respectively.

TABLE 3

| Descaling solutions | % Residue removed |
| --- | --- |
| Descaler F | 97.48 |
| Descaler F/2 | 82.60 |
| Descaler I | 75.01 |
| Descaler D | 71.75 |
| Descaler H | 71.70 |
| Descaler J | 71.22 |
| Descaler E | 69.70 |
| Descaler K | 38.89 |
| Descaler G | 22.93 |

TABLE 4

| Descaling D: | 10% potassium carbonate |
| --- | --- |
| Descaling E: | 10% sodium carbonate monohydrate |
| Descaling F: | 10% pot. carb. + 10% Na carb. + Monotrope[1] |
| Descaling F/2: | 50% dilution of F |
| Descaling G: | 5% sodium carbonate monohydrate |
| Descaling H: | 10% sodium carbonate monohydrate + Monotrope |
| Descaling I: | 10% pot. carb. + Monotrope |
| Descaling J: | 5% pot. carb. + 5% Na carb. monohydrate + Monotrope |
| Descaling K: | 5% potassium carbonate |

[1]sodium nonanoate

From Table 3, it can be seen that descaling compositions F were more effective than the other descaling compositions which contain only one of the sodium carbonate or potassium carbonate salts or even with respect to descaling composition J which contained small amounts of each of the respective carbonate salts.

EXAMPLE 3

The following formula represents a preferred descaler concentrate of the present invention. In use, the concentrate would be diluted 15 to 20%.

64.43% water
14.27% potassium carbonate
14.27% sodium carbonate monohydrate
7.80% monotrope
0.23% Industrol DW-5

1. alcohol alkoxylate, BASF, defoaming and surface rinse properties

What is claimed is:

1. A method of removing alkaline salt-based scale from a surface comprising contacting said scale with an aqueous solution comprising a mixture of alkali metal carbonate salts wherein the alkali metals are different.

2. The method of claim 1 wherein said mixture of alkali metal carbonate salts comprises a mixture of sodium and potassium carbonate salts.

3. The method of claim 1 wherein said scale further includes organic scale and said aqueous solution further includes a hydrotrope to effect the removal of said organic scale.

4. The method of claim 3 wherein said hydrotrope comprises an alkali metal salt of a $C_7$–$C_{13}$ linear monocarboxylic acid.

5. The method of claim 1 wherein the pH of said aqueous solution ranges from about 10–12.5.

6. The method of claim 5 wherein the pH of said aqueous solution ranges from about 10.5–12.5.

7. The method of claim 3 wherein said aqueous solution further includes a defoaming agent.

8. The method of claim 1 wherein said alkaline salt-based scale comprises alkali metal carbonates, silicates or mixtures thereof.

9. The method of claim 1 wherein said aqueous solution is heated to a temperature of from about 100°–160° F.

10. The method of claim 9 wherein said aqueous solution is heated to a temperature of from about 125°–150° F.

11. The method of claim 1 wherein said aqueous solution is applied to said scale by immersion, spraying, or hand-held applicating device.

* * * * *